United States Patent [19]
Rauscher

[11] Patent Number: 6,107,898
[45] Date of Patent: Aug. 22, 2000

[54] MICROWAVE CHANNELIZED BANDPASS FILTER HAVING TWO CHANNELS

[75] Inventor: Christen Rauscher, Alexandria, Va.

[73] Assignee: The United State of America as represented by the Secretary of the Navy, Washington, D.C.

[21] Appl. No.: 09/069,855

[22] Filed: Apr. 30, 1998

[51] Int. Cl.[7] .................................................. H03H 7/01
[52] U.S. Cl. ........................................ 333/175; 333/166
[58] Field of Search .................................. 333/126, 129, 333/132, 134, 174, 175, 202, 109, 117, 167, 166

[56] References Cited

U.S. PATENT DOCUMENTS

| | | | |
|---|---|---|---|
| 3,646,480 | 2/1972 | Spaulding | 333/18 |
| 4,238,766 | 12/1980 | Masuda | 358/86 |
| 4,661,789 | 4/1987 | Rauscher | 333/202 |
| 4,743,871 | 5/1988 | Searle | 333/166 |
| 4,998,080 | 3/1991 | Hanna | 333/202 |
| 5,001,445 | 3/1991 | Horvath et al. | 333/166 |
| 5,097,236 | 3/1992 | Wakino et al. | 333/175 |
| 5,132,647 | 7/1992 | Lopez et al. | 333/175 |
| 5,180,999 | 1/1993 | Edwards | 333/175 |
| 5,339,057 | 8/1994 | Rauscher | 333/166 |
| 5,438,572 | 8/1995 | Rauscher | 370/123 |
| 5,525,945 | 6/1996 | Chiappetta et al. | 333/202 |
| 5,666,092 | 9/1997 | Yamamoto et al. | 333/194 |
| 5,721,518 | 2/1998 | Hahn | 333/174 X |
| 5,815,052 | 9/1998 | Nakajima et al. | 333/176 X |
| 5,883,553 | 3/1999 | Tsumura | 333/174 |

FOREIGN PATENT DOCUMENTS

| | | |
|---|---|---|
| 3920937 | 3/1991 | Germany . |
| 63-206029 | 8/1988 | Japan . |
| 63-214014 | 9/1988 | Japan . |
| 5-167311 | 7/1993 | Japan . |
| 2145306 | 3/1985 | United Kingdom . |

*Primary Examiner*—Seungsook Ham
*Attorney, Agent, or Firm*—Barry A. Edelberg; Sally Ferrett

[57] ABSTRACT

A channelized active bandpass filter having only two branches which provide respective frequency-selective feedforward signal paths. The two signal paths have overlapping frequency response bands such that the combination of the two paths provides a composite filter with a bandpass response. The two branches may be provided with bandpass transfer characteristics of different orders and shapes, such as a second-order response and a fourth-order response. Two-way signal splitting and combining to define the two channels may be performed with in-phase splitters and combiners, for example, or diplexer circuits, each composed of two bandpass filters with different characteristics but overlapping frequency responses and preferably approximately equal center frequencies. Combinations of the two splitting and combining arrangements are also usable.

3 Claims, 5 Drawing Sheets

MICROWAVE CHANNELIZED BANDPASS FILTER HAVING TWO CHANNELS

BACKGROUND OF THE INVENTION

1. Field of the Invention

The invention relates to microwave filters that are compatible with microwave monolithic integrated circuit (MMIC) technology, and more particular to a microwave channelized bandpass filter having two channels.

2. Description of Background Art

There is an urgent need for small, light-weight, low-cost microwave filters that are compatible with microwave monolithic integrated circuit (MMIC) technology, yet offer low insertion loss and high selectivity. Such filters are needed particularly for next-generation ultra-compact multi-function systems for defense applications. There is also a need for such filters in frequency synthesizers and in commercial mobile communication systems.

The concept of the microwave channelized filter, as described in the present inventor's U.S. Pat. No. 5,339,057 and in C. Rauscher, "Microwave Channelized Active Filters . . . ," IEEE Transactions on Microwave Theory and Techniques, pp. 122–123, January 1996, both expressly incorporated by reference, marked a major breakthrough with regard to the realization of miniature, highly selective microwave filters. The breakthrough is based on an active-filter concept that uses parallel-connected, frequency-selective network branches to accomplish filter selectivity through constructive and destructive interference among branch signal components, thereby circumventing limitations related to circuit stability and noise that have rendered earlier microwave active-filter approaches impractical. The feed-forward architectures of these filters resemble those of analog transversal filters, and exhibit performance and operational advantages similar to those of transversal filters. However, the channelized filters use frequency-selective feed-forward signal paths (instead of the frequency-independent ones used in transversal solutions) which, in turn, reduces the required number of signal paths or branches to two or three, down from the fifty to one hundred branches needed in the case of analog transversal filters. The space savings are dramatic, without compromise of performance.

Channelized filters with low-pass, high-pass, and band-reject responses all require a minimum of two feed-forward branches. On the other hand, channelized filters with band-pass responses, which encompass the majority of applications, have to date required a minimum of three branches. Adding the third branch causes the actual filter size to increase by far more than the simple three-to-two ratio which is suggested by the respective numbers of branches in the two types of circuits. This is due to the relatively large circuit area needed to realize three-way signal splitters and combiners, when compared to the much smaller and simpler two-way splitters and combiners used in low-pass, high-pass, and band-reject situations.

SUMMARY OF THE INVENTION

Accordingly, there is a need for a reduction in the circuit area occupied by a channelized filter with a bandpass response.

To address this need, the invention provides a channelized bandpass filter with only two branches which provide respective frequency-selective signal paths that may contain substantially unilateral circuits in either or both branches to help estsblish feed-forward signal flow.

In this connection, the invention represents a significant improvement over the known channelized filters. Limiting the number of frequency-selective feed-forward branches to two has not previously been thought possible in a bandpass filter. It allows a channelized bandpass filter to be realized in a fraction of the space formerly needed to implement a bandpass filter in accordance with the original channelized filter concept.

According to another aspect of the invention, the two branches may be provided with bandpass transfer characteristics of different orders and shapes. One branch may be provided with a second-order response and the other branch may be provided with a fourth-order response, for example. In contrast, the known channelized bandpass filters had three branches with simpler transfer characteristics of the same order.

According to a further aspect of the invention, two-way signal splitting and combining to define the two channels may be performed with in-phase splitters and combiners, for example. Alternatively, two-way splitting and combining can be performed with diplexer circuits, each composed of two bandpass filters. Combinations of the two types of splitting and combining are also possible. In both of these splitting and combining arrangements, the two respective passband responses intentionally occupy, at least in part, a common frequency range within the composite filter passband. That is, despite the generally different respective shapes, bandwidths and/or orders that the two branch filter responses may exhibit, their passband center frequencies at least approximately coincide. Separate branch filters having responses with overlapping passbands have not previously been used in a channelized bandpass filter. This is particularly remarkable in the case of the diplexer-coupled arrangement. Conventionally, diplexers have been constructed to have a pair of distinct, separated frequency response bands, not overlapping response passbands as in this aspect of the present invention.

The sharing of passband frequencies and the approximately common center frequencies of the respective branches represent an important improvement according to the invention. In contast, the three branch filter responses in the prior-art three-channel filter configuration must inevitably have different center frequencies in order for the three-channel filter to function as intended.

Thus, the disclosed microwave channelized bandpass filter results in a dramatic reduction in the size of previous bandpass filters. When compared to earlier three-branch configurations, the reduction in size originates from the ability to make do with only two branches, albeit branches of a somewhat higher level of circuit sophistication.

If one or more of the substantially unilateral circuits used to help establish feed-forward branch signal flow are amplifiers, the two-branch approach can be rendered very tolerant of passive-circuit losses, allowing overall circuit size to be kept to a minimum through reliance on lumped passive circuit elements, which tend to be rather lossy. This, in turn, makes it possible to realize high-selectivity, low-noise, stable filters in MMIC form.

The disclosed circuit can be implemented either in hybrid-circuit format, or in MMIC form, for example. In addition, any other combination or selection of substantially unilateral two-port components and/or and passive, frequency-selective branch circuits can be used to implement the invention. Aside from amplifiers which are typically used, optional unilateral components may include, for example, nonrecipocal ferrite devices, such as circulators and isolators. The implementation may also involve, for instance, the use of high-Q dielectric resonators to provide ultra-sharp filter characteristics in situations where performance is important. In such a situation it may be less important to realize the circuit as a planar structure. Even though channelized filters can be rendered very tolerant of passive circuit losses, the lower these losses are, the better. Planar structures are thought to be generally preferable from a fabrication and size point of view, other factors being equal.

Other features and advantages of the invention will be understood from the following detailed description of embodiments thereof, with reference to the drawings.

DETAILED DESCRIPTION OF EMBODIMENTS OF THE INVENTION

Figure 1:
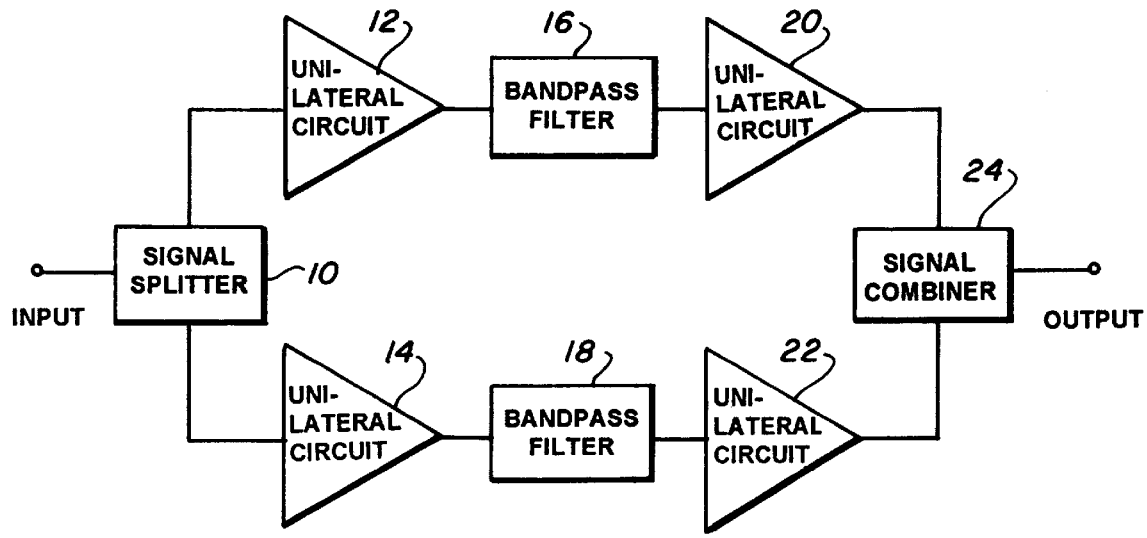
FIG. 1 is a circuit diagram showing a first embodiment of the invention, having feed-forward branches defined between a pair of signal splitters.

A first embodiment of the invention is shown in FIG. 1. An input signal is split by a signal splitter 10 to produce two signals of same or different strengths which are then passed on to respective unilateral circuits 12 and 14, either or both of which are optional. The two signals are applied to first and second bandpass filters 16 and 18 having different characteristics. In this example, the first bandpass filter has a second-order response and the second bandpass filter has a fourth-order response. The respective outputs of the bandpass filters 16 and 18 are passed through corresponding optional unilateral circuits 20 and 22, and then combined by a combiner 24 to produce an output signal.

Figure 2:
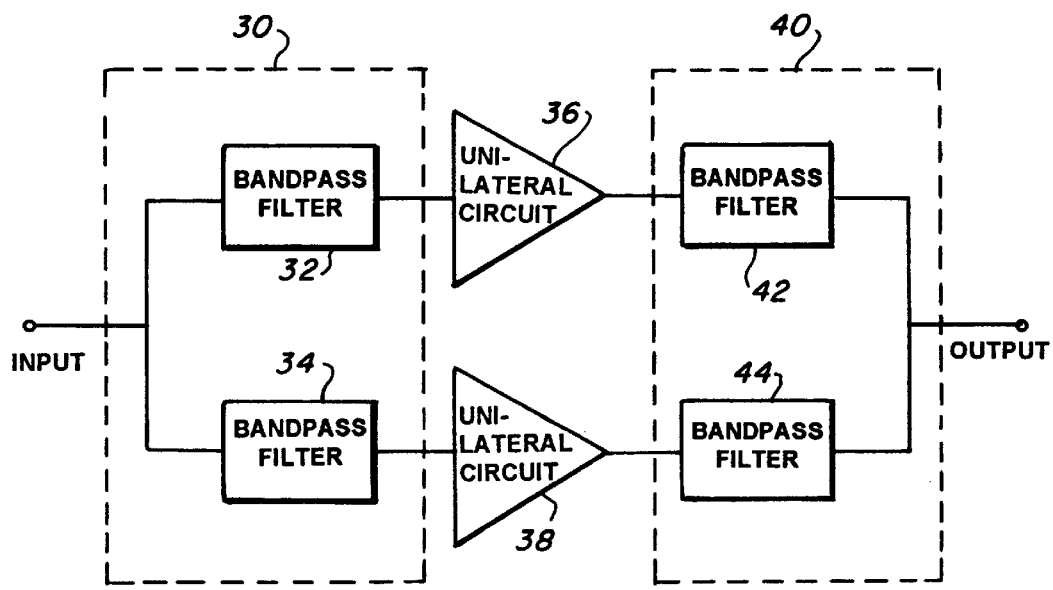
FIG. 2 is a circuit diagram showing a second embodiment of the invention, having feed-forward branches defined between a pair of diplexers.

In a second embodiment of the invention, shown in FIG. 2, a first diplexer 30 comprises first and second bandpass filters 32 and 34 having different characteristics. The respective diplexer outputs of the first and second bandpass filters 32 and 34 are passed on to corresponding unilateral branch circuits 36 and 38, one of which may be optional. The outputs of the unilateral circuits 36 and 38 are then applied as respective inputs to a second diplexer 40, which comprises third and fourth bandpass filters 42 and 44 having different characteristics which correspond to the characteristics of the bandpass filters 32 and 34. In this example, as in the first embodiment of the invention, the combination of the first and third bandpass filters 32, 42 provides a lower-order response than the combination of the second and fourth bandpass filters 34, 44. To accomplish this, it is often preferable but not mandatory for the first and third bandpass filters 32, 42 to have similar lower-order responses, and for the second and fourth bandpass filters 34, 44 to have similar higher-order responses.

At the desired transmission-null frequency below the passband, the two branch amplitude responses should substantially coincide and their respective phases should be at least approximately 180 degrees apart, thus permitting complete or partial cancellation between the two branch signals at the output of the composite channelized filter.

In the desired passband region, the respective amplitude and phase responses of the two branches should permit the respective branch responses to form a flat overall passband response. Thus, the two branch signals should constructively interact across the passband frequencies, and the branch amplitude characteristics should be chosen so as to complement each other when added at the composite filter output.

At the desired transmission null frequency above the passband, the two branch signals should again substantially coincide in amplitude, and should again be at least approximately 180 degrees out of phase to permit complete or partial cancellation.

The first and second embodiments achieve these results most compactly, with filters of different respective orders and response shapes in the two branches. The lower-order branch will exhibit more gradually sloping filter skirts than its higher-order counterpart, thus permitting an amplitude response crossover between the respective branch signal responses. At the same time, the different filter orders associated with the two branches provide the necessary phase differential between the branch signals, going from approximately 180 degrees out of phase at the low-end null frequency, to in-phase in the vicinity of the passband center, to again approximately 180 degrees out of phase at the desired high-end null frequency.

Thus, the first and second embodiments are believed to be the most advantageous way of implementing the invention, because resonant structures forming branch filters provide the most compact structure for realizing fast-changing phase responses, as are needed to spin the branch phase differential through a total of 360 degrees over the preferably narrow frequency band between desired transmission nulls.

Summarizing, in the foregoing embodiments, both the orders and the shapes of the respective branch amplitude responses will differ. In particular, the bandwidths of the two branch responses may differ. However, they preferably have approximately the same center frequency, with some offset allowed, as long as the composite filter exhibits acceptably sharp amplitude roll-off above and below the passband, as determined by the positions of the transmission nulls. As previously discussed, the cancellation of the two branch signals at the designated transmission null frequencies need not be complete according to the invention, as it can be advantagous, depending on the application, to trade null signal rejection against other response attributes.

Figure 3:
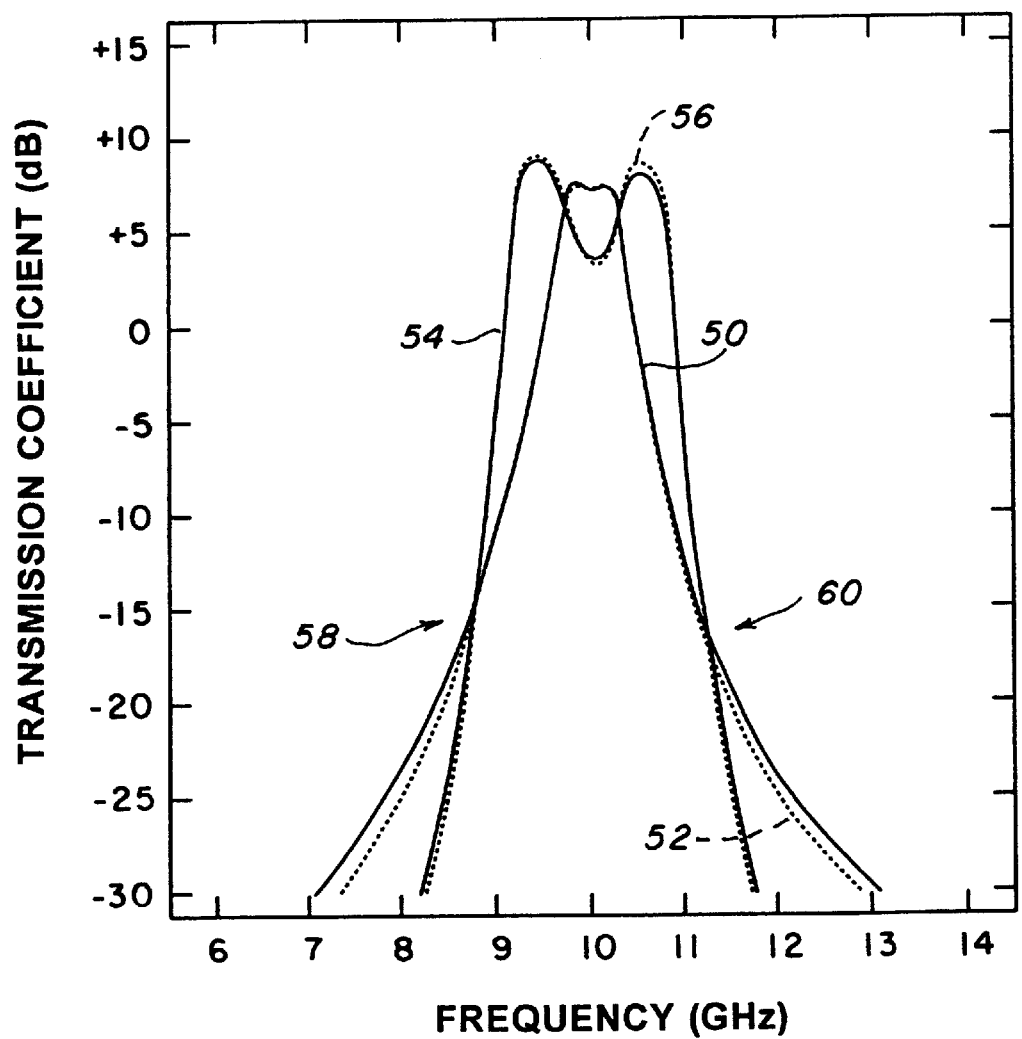
FIG. 3 is a graph showing the respective transfer characteristics of the feed-forward branches in the circuit shown in FIG. 1.
Figure 4:
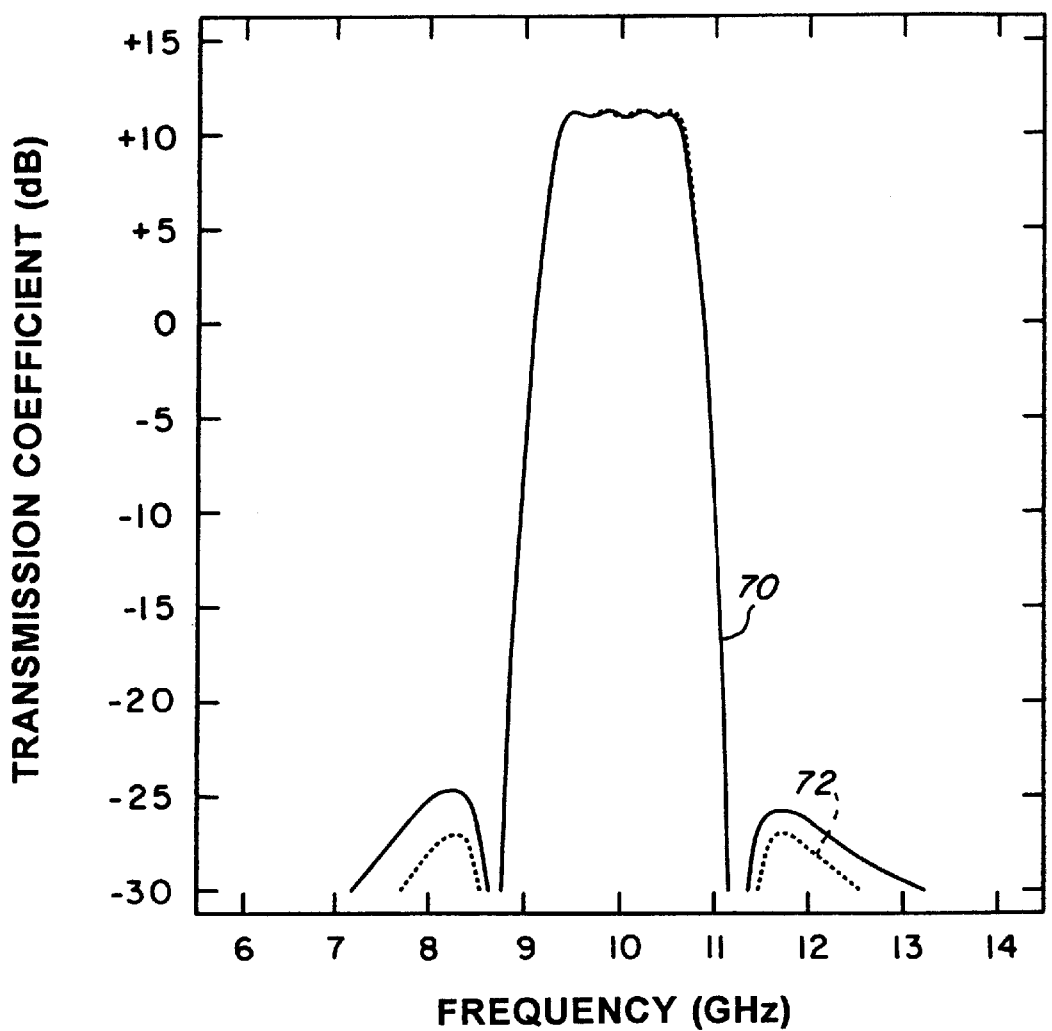
FIG. 4 is a graph showing the composite transfer characteristics of the circuit shown in FIG. 1.

An experimental bandpass filter was constructed as shown in FIG. 1, employing MMIC amplifiers as unilateral branch circuits. The filter's two-channel transfer characteristics are depicted in FIG. 3, in which the dotted lines 52, 56 indicate calculated results, and the solid lines 50, 54 depict measured responses. The marked differences between the respective responses of the two channels should be noted. The response 50 of the first bandpass filter 16 is a second-order response and the response 54 of the second bandpass filter 18 is a fourth-order response. The respective responses add up in the passband to provide a well-behaved passband response, and are 180 degrees out of phase at their two outward cross-over points 58 and 60 to introduce zeros of transmission through cancellation. The resulting measured response 70 and predicted response 72 of the composite channelized active filter are shown in FIG. 4.

In some situations it may be difficult for the branch filters of the first and second embodiments to achieve the desired fast phase rotations between the upper and lower null frequencies. To address this problem, according to third and fourth embodiments of the invention, the composite filter may be constructed as shown in FIGS. 5 and 6, which correspond respectively to FIGS. 1 and 2, like elements and parts being indicated by identical reference numerals.

Figure 5:
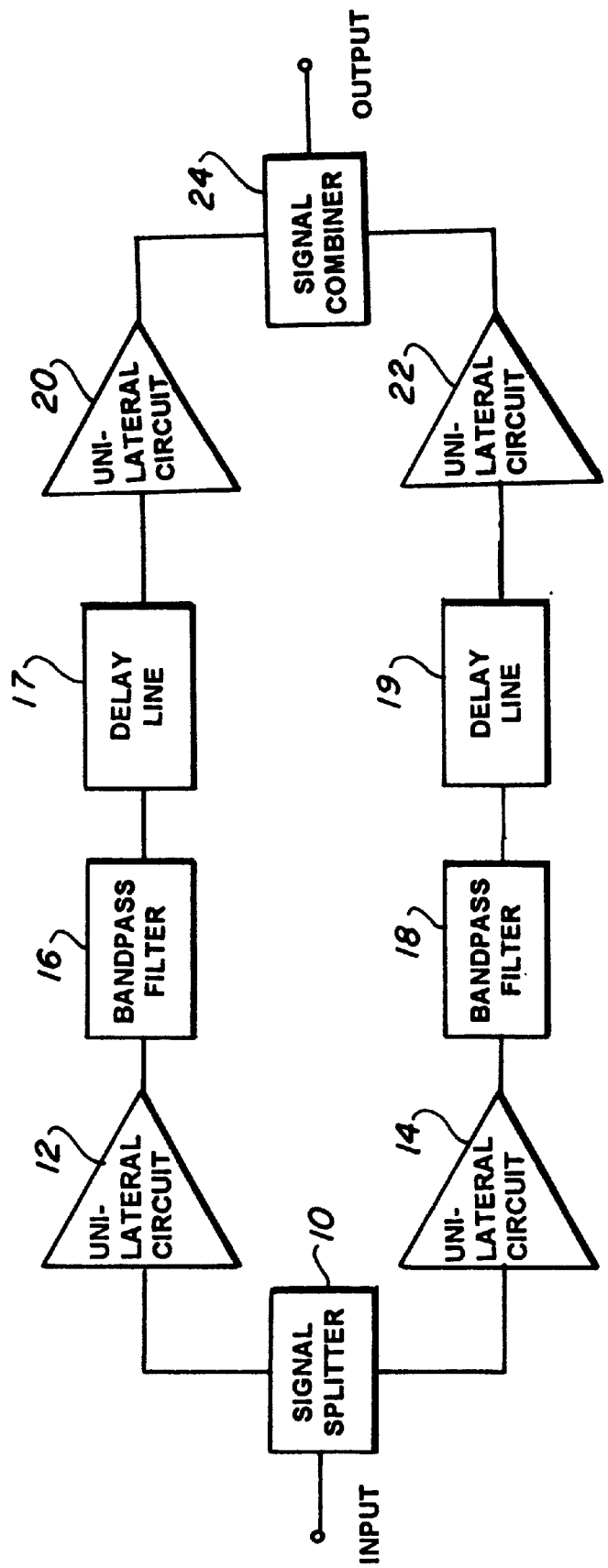
FIG. 5 is a circuit diagram showing a third embodiment of the invention which is similar to the first embodiment, having in addition delay lines in the respective feed-forward branches.

In the circuit of FIG. 5, in addition to the elements in the circuit of FIG. 1, a delay line 17 is connected between the bandpass filter 16 and the unilateral branch circuit 20, and likewise, a delay line 19 is connected between the bandpass filter 18 and the unilateral branch circuit 22. As in the first embodiment, the incorporation of unilateral circuits into respective branches is optional as long as feed-forward branch signal flow is established through alternate means, such as the design of the signal splitter 10 and/or signal combiner 24 shown in FIG. 5.

Figure 6:
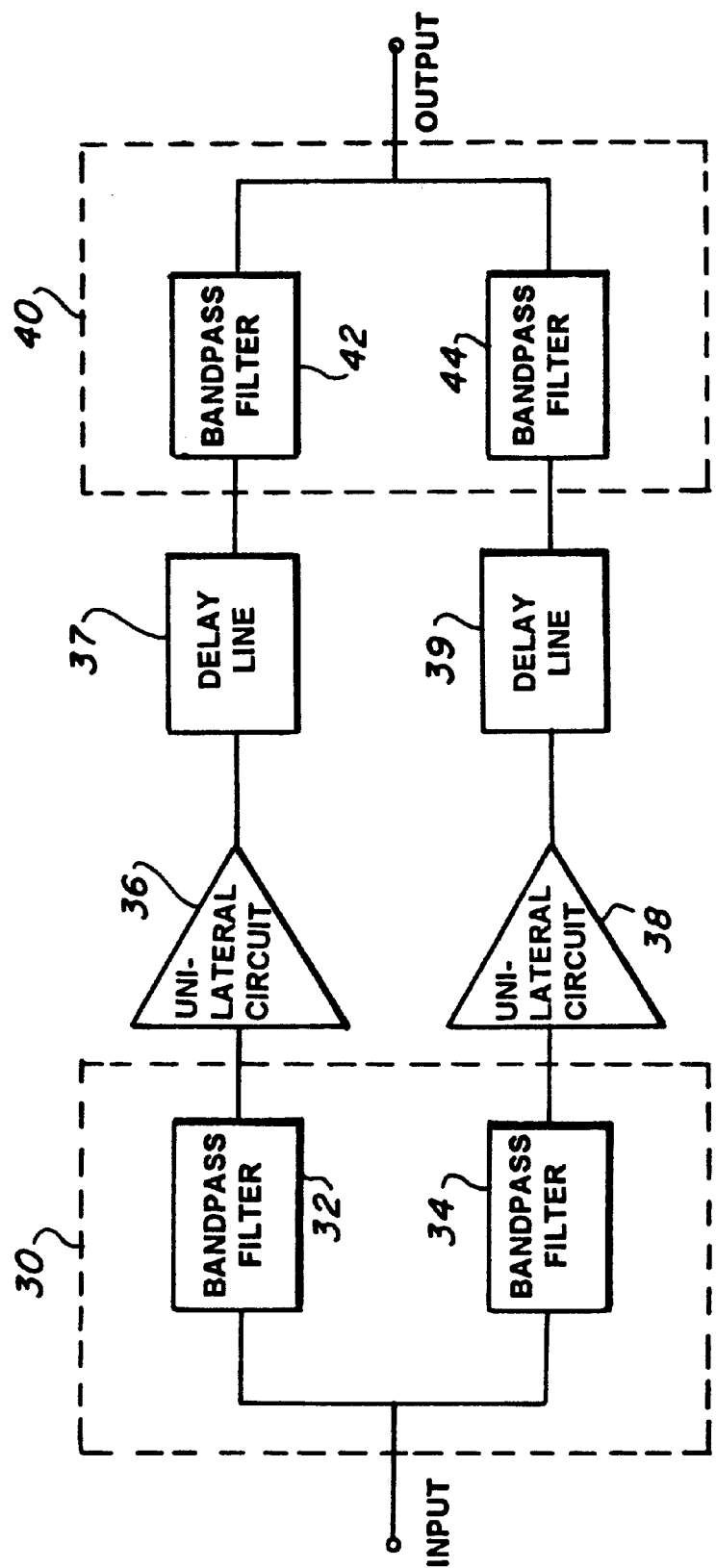
FIG. 6 is a circuit diagram showing a fourth embodiment of the invention which is similar to the second embodiment, having in addition delay lines in the respective feed-forward branches.

In the circuit of FIG. 6, in addition to the elements in the circuit of FIG. 2, a delay line 37 is connected between the optional unilateral circuit 36 and the bandpass filter 42, and likewise, a delay line 39 is connected between the optional unilateral circuit 38 and the bandpass filter 44. In this configuration, at least one branch will contain at least one unilateral circuit to establish substantially feed-forward branch signal flow.

Either of the delay lines may be omitted, or placed at a different location in the circuit, as long as the desired composite response is obtained. The delay lines may be provided by transmission line segments, for example.

In the third and fourth embodiments, bandpass filters having similar behavior and the same filter order may be used, in which case the needed fast phase rotations between the branch signals may be achieved by the delay lines. The drawback of this scheme, however, is that in a filter with a narrow passband, where the phase differential between the branches may have to swing through 360 degrees over a narrow frequency range (from one null or approximation thereof to the other), a very long time delay differential between the branches may be required to achieve sufficiently fast phase rotations. The resultant large combined delay line length in turn increases the physical dimensions of the filter, which is not desirable.

Thus, to obtain faster phase rotations without increasing the physical dimensions of the filter, a combination of the mentioned approaches can be used. In other words, the necessary phase rotation and the shaping of the amplitude response are accomplished predominantly through the use of branch filters with different orders and shapes, as described above in connection with the first and second embodiments, and delay lines such as short transmission line segments are used to obtain fine phase adjustment in one or both of the two branches.

Although embodiments of the invention have been described herein, the invention is not limited to such embodiments, but rather includes any modifications, variations and equivalents which may occur to those having the ordinary level of skill in the art. This pertains, in particular, to the ways in which branch feed-forward signal flow is substantially achieved and branch frequency selectivity is implemented.

What is claimed is:

1. A channelized bandpass filter comprising in combination:

a first branch circuit which includes a first bandpass filter which receives an input signal and which outputs a first filtered signal;

a second branch circuit which includes a second bandpass filter which receives said input signal and which outputs a second filtered signal;

said first branch circuit further including a third bandpass filter which receives said first filtered signal and provides a first branch output signal;

said second branch circuit further including a fourth bandpass filter which receives said second filtered signal and provides a second branch output signal;

said first and second branch circuits being coupled so that said first and second branch output signals combine as an output of said channelized bandpass filter, said first and second branch circuits having respective first and second response characteristics with overlapping frequency bands, such that said channelized bandpass filter has a bandpass response characteristic;

at least one amplifier disposed in at least an associated one of said first and second branch circuits;

at least one delay line coupled in a respective one of said first and second branch circuits;

wherein said at least one delay line is coupled in said respective one of said branch circuits, between the corresponding amplifier and the corresponding one of said third and fourth bandpass filters.

2. A channelized bandpass filter as in claim 1, wherein:

said first and second bandpass filters are comprised of a first diplexer with a common input port which receives said input signal, and a pair of diplexer output ports which respectively output said first and second filtered signals; and said third and fourth bandpass filters are comprised of a second diplexer with a pair of diplexer input ports which respectively receive said first and second filtered signals, and a common output port which outputs said output of said channelized bandpass filter.

3. A channelized bandpass filter according to claim 1, wherein said delay line is a transmission line.

* * * * *